June 30, 1964 E. RASMANIS 3,139,361

METHOD OF FORMING SINGLE CRYSTAL FILMS ON A MATERIAL IN FLUID FORM

Filed Dec. 26, 1961

INVENTOR.
EGONS RASMANIS

BY Spencer E. Olson

ATTORNEY 3,139,361
Patented June 30, 1964

3,139,361

METHOD OF FORMING SINGLE CRYSTAL FILMS ON A MATERIAL IN FLUID FORM

Egons Rasmanis, Burlington, Mass., assignor to Sylvania Electric Products Inc., a corporation of Delaware Filed Dec. 26, 1961, Ser. No. 161,992
16 Claims. (Cl. 148—175)

This invention relates to methods of forming single crystal films of materials, and is more particularly concerned with methods for forming or depositing semiconducting single crystal films on non-single crystal surface.

With the increasing demand for reliability and space and weight reduction, advanced technologies are being developed for forming functional electronic circuits instead of the conventional, single-part-at-a-time approach which has long been employed in the design of circuits. One approach which is gaining some acceptance is known as molecular electronics, in which functional circuits are formed on and in a single crystal body of semiconductive material. Another approach, which may be regarded as compatible and complementary with molecular electronics is the thin film circuit approach in which passive networks are formed by vacuum or chemical deposition of optimized materials on a suitable substrate. Each approach has benefits and advantages, but neither constitutes a total solution to the philosophy of forming advanced electronic circuit functions. The ideal solution appears to be a combination of both molecular and thin film circuitry fabricated at one place and at the same time to create optimized circuit functions. At the present time, for example, microelectronic circuitry is being fabricated by depositing passive networks including resistance, inductance, and capacitance on a substrate, with the active circuit elements, such as diodes or transistors, or other semiconductor devices, connected in the thin film circuits after having been made elsewhere employing techniques well known in the semiconductor art. That is, thin film technology is used to fabricate a portion of the circuit, and molecular technologies are employed to fabricate the active elements of the circuit, which must thereafter be incorporated in the thin film circuit. In the interest of utilizing the best features of both molecular and thin film circuitry, it is desirable to integrate these technologies into a single technology, but heretofore this has been impossible because of the lack of a suitable method of forming single crystal, device-quality, thin films of semiconducting materials on a non-semiconducting and non-single crystal substrate.

There are several known methods of forming single crystal films of germanium, silicon, or other semiconducting materials, including: chemical or pyrolytic vapor decomposition, vacuum evaporation, wet electrochemical processing, or molten alloy deposition. Of these, the most commonly used technique for the fabrication of semiconductor bodies is that of chemical vapor deposition. In order to form a single crystal of the semiconductor material by this method, it is necessary to deposit the film on a seed crystal of the material, the crystal lattice structure of which must be the same as that of the desired finished crystal. This technique of growing semiconductor bodies is known as epitaxial growth, the formation of a single crystal occurring because the arriving atoms tend to arrange themselves in the same crystal lattice as the crystal lattice of the substrate upon which they are impinging. In short, to obtain single-crystal film growth by epitaxy it is necessary to start with a single crystal substrate. Otherwise, epitaxial growth will not occur and the resulting film will be polycrystalline in nature and of no value in forming molecular circuits.

Present day thin-film microcircuits, however, are normally deposited on a non-semiconductor, non-single crystal material such as ceramic, quartz, glass, or glazed ceramic, which are all either polycrystalline or non-crystalline in nature. Previous efforts to deposit semiconductor materials on such substrates have yielded amorphous films which are unsuitable for P–N junction formation. As was stated earlier, it would be desirable to be able to deposit a single crystal film of a semiconductor material directly onto the non-single crystal substrate on which other thin film materials are deposited for this would yield optimized molecular circuitry.

In the semiconductor device field, too, present techniques for forming or growing single crystals of semiconductor materials, or junctions of such materials having different conductivity types, are relatively expensive, and, more important, limit the configuration and size of devices which can be built. For example, solar cells are desirably of large area, and to gain wide acceptance must be relatively inexpensive, but present methods of semiconductor crystal and junction formation has limited the size of cells which can be fabricated at a reasonable cost. Therefore, it would be desirable to be able to deposit single crystal, large area films of materials, such as semiconductors, or large area P–N junctions, preferably on a supporting structure, in an economical manner.

The primary object of this invention is to enable the fabrication of single crystal films on a surface of different material, and possessing different crystal structure than the material of the film.

More specifically, another object of this invention is to enable the growth of semiconducting single crystal films, such as single crystal films of silicon or germanium, or non-single crystal surfaces.

Another object of the invention is to enable the fabrication of single crystal films of semiconducting materials on either an insulating or a conducting substrate, in the latter case to provide an electrical terminal or heat removal path for the crystal.

Still another object of the invention is to enable the fabrication of semiconductor devices, containing one or more junctions, directly onto a substrate having a crystalline structure differing from that of the material of which the device is formed, which devices may be of larger size and of different configurations than can be fabricated with available techniques.

Briefly, the invention in its broadest aspect is concerned with the formation or growing of a single crystal film of an inorganic material, particularly inorganic semiconductor materials in elemental or compound form on a supporting structure or substrate formed of a material which is non-single crystal in nature. An essential feature of the method is to create a condition at the surface of the substrate which allows the material to be deposited, arriving at the surface, preferably in vapor form, to arrange itself on the surface in single crystal form. This is accomplished by providing a surface material on the substrate, which, for example, may be formed of alumina, which may be made highly fluid, as by heating, and which is non-reactive, or substantially non-reactive with the material being deposited. A suitable surface may be provided by coating the substrate with a glaze of glass of a composition to be fluid at a temperature below the melting point of the material to be deposited, and below the melting point of the substrate material. Or, a surface of the substrate may be metallized with a thin layer of metal, the melting point of which is below the melting point of the material to be deposited. In either case, the thin coating, when heated to the temperature at which it becomes fluid, is retained on the substrate by surface tension, but each molecule of the coating material has a free volume surrounding it in which the molecules can move and to that extent it behaves like a gas. Because of the high atomic surface mobility, the atoms of the material being deposited arriving at the surface are permitted to arrange themselves into single crystal form. In other words, the crystal structure of the arriving material is not limited by the structure of the substrate because of the fluid condition of the surface of the substrate. Surface or coating materials for the substrate suitable for use in the method of the present invention are, in general, solid at ordinary or room temperatures, consistent with the objective of fabricating final devices having utility at such temperatures. Accordingly, the terms such as "fluid" and "fluidity" are used herein in the more restrictive sense to describe the character of such materials in their molten or liquid condition only, and are not intended to include materials in the gas phase.

The material to be deposited may be brought into the vicinity of the fluid surface in vapor form in a number of ways, such as by known pyrolytic vapor decomposition techniques. Also, vacuum evaporation, plasma arc spraying, and other similar methods of creating a finely divided particulate or vapor atmosphere in the region of the fluid surface may be used. The vapor condenses on the fluid surface, arranging itself in single crystal form. After a crystal of desired thickness is formed, and the fluid surface cooled to hardness, the deposited material retains its single crystal characteristics and is rigidly held in place on the substrate.

The invention and the above-noted and other features thereof will be understood more clearly and fully from the following detailed description with reference to the accompanying drawings, in which.

Figure 1:
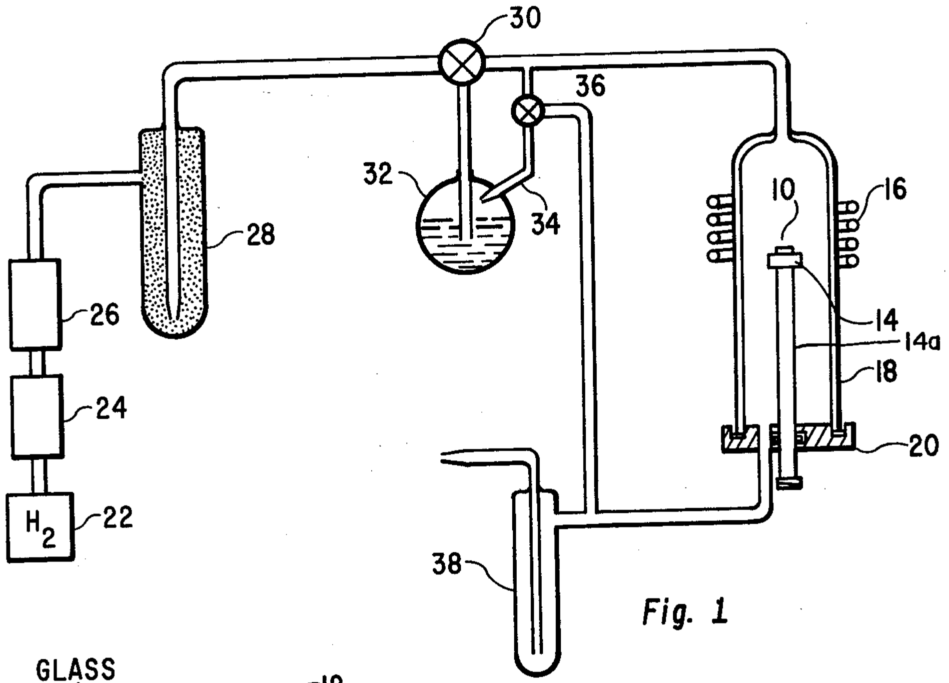
FIG. 1 illustrates suitable apparatus to carry out the method of the present invention to grow single crystal films.
Figure 2:
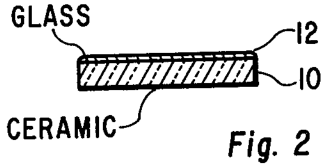
FIG. 2 is a side view of a substrate having a glass layer deposited thereon in accordance with this invention; and, FIGS. 3 and 4 are respectively a perspective view and an elevation cross-section, greatly enlarged, of a substrate having successive layers of P- and N-type semiconductor material deposited thereon, in accordance with the invention, to form four diode devices.

While it appears theoretically possible to employ the present method to form single crystals of a wide variety of materials, particularly elements of Groups III and V and II and VI of the Periodic Table, as well as binary and trinary compounds of elements used in conventional semiconductor technology, the principle has been confirmed with silicon and will be described in detail in that connection. Thin films of silicon, of various shapes and sizes, which exhibit single crystal characteristics have been formed on a substrate of alumina ceramic, coated with a glaze of glass, which when heated to an appropriate temperature provided the requisite fluid surface. FIG. 1, to which reference is now made, shows the apparatus used to carry the silicon in its vapor phase into the vicinity of the fluid surface, which will be recognized as being very similar to known apparatus now employed for the epitaxial growth of silicon crystals. In the illustrated example, the silicon was deposited as a single crystal thin film on a thin wafer 10 of alumina ceramic. To provide a chemical inertness and stability at the surface of the substrate, and to achieve the high degree of inert fluidity necessary for silicon in vapor form to arrange itself as a single crystal, a thin layer of glass 12 (see FIG. 2) was applied to the surface of the substrate. The thin layer may be applied by silk screening, spraying or dipping, and firing onto the substrate, the substrate material having a higher melting point than the temperature at which the glass is fluid, to provide a coating which can be as thin as .00012 inch. The glass used has a melting point so as to be fluid below the temperature at which the silicon film will form. The melting point of silicon being 1420° C., a temperature range for the molten glass surface between 1000 and 1250° C. is satisfactory. Soda lime glass, for example, softens at approximately 700° C., and is quite fluid at temperatures of 1000 to 1250° C. In spite of its fluidity, however, it is retained on the substrate 10, and completely covers it, due to the surface tension of the molten layer of glass.

The glazed substrate 10 is heated to the proper temperature by means of a graphite adapter 14, which may be in the form of a disc, which, in turn, is heated by an RF induction coil 16 surrounding a cylindrical reaction chamber or tube 18 which is sealed at its lower end to a suitable closure plate 20. By controlling the intensity of the RF field, the temperature of the graphite disc, and hence the temperature of the molten glaze 12, can be conveniently and closely controlled.

The silicon compound is carried into the reaction chamber 18 in its vapor phase, hydrogen being used as a carrier gas for silicon chloride vapor from which the silicon is derived by pyrolytic decomposition. The apparatus for bringing the silicon compound vapor into the vicinity of the substrate comprises a source of hydrogen 22 which is connected in series to a deoxidizing unit 24, such as a De-oxo drying tube, a flow meter 26 and a cold trap 28 filled with a molecular sieve maintained at liquid nitrogen temperature, which dry the hydrogen and remove any oxygen or water vapor which may be present in the hydrogen gas. The gas outlet from trap 28 is connected to a three-way valve 30 which controls whether the flow of hydrogen is completely shut off or whether it is passed to flask 32 or the reaction chamber 18. Flask 32 is provided with a gas outlet 34 which is connected through a second three-way valve 36 to the tubing between valve 30 and the reaction chamber, one port of which is designed to allow gas to flow from flask 32 to the effluent disposal system 38.

Flask 32 contains silicon chloride in liquid form, the gas inlet pipe extending into the liquid in order that gas may be bubbled through the liquid to produce a silicon chloride vapor-hydrogen mixture. When valve 30 is positioned to allow hydrogen to bubble into flask 32, and valve 36 is positioned to allow gas to flow from flask 32 to reaction chamber 18, this gas-vapor mixture is carried past or into the vicinity of substrate 10 whose surface is molten and at an appropriate temperature as above-described. The excess gas is carried through the chamber and into the effluent gas disposal system 38.

In operating the apparatus of FIG. 1, the glazed substrate 10 is positioned on the graphite adapter 14, which in turn is supported more or less centrally of the chamber on a supporting rod 14*a*, and all connections are sealed. The induction coils 16 are energized, and the temperature of the substrate 10 brought up to the desired temperature to melt and maintain the molten glaze at the desired temperature, for example, 1000 to 1250° C. The valve 30 is opened in order to flush the complete gas purification train together with the reaction chamber and gas disposal section. While flushing the apparatus, the silicon chloride flask 32 is cooled down to a temperature of the order of −30 to −40° C.

For the deposition run, valves 30 and 36 are positioned to allow the dried hydrogen to bubble through the silicon chloride and to permit the vapor mixture of silicon chloride and hydrogen to be carried into the reaction chamber. As the vapor mixture reaches the vicinity of the heated substrate, the silicon chloride decomposes into elemental silicon and chlorine, this reaction occurring at approximately 1000° C. The elemental silicon deposits on the molten surface of the substrate, and because of the atomic fluidity of the surface, the silicon arranges itself in a single crystal lattice structure. Apparently because of surface tension of the fluid surface, there is no evident mixing of the glass and the arriving silicon. While the flow rate of the vapor mixture is largely dictated by the nature of the apparatus, a rate of one-half to one liter per minute has been found satisfactory. With this rate of flow of gas, silicon in single crystal form was deposited at a rate of approximately one micron per minute. The hydrogen chloride then passes out of the reaction chamber 18 through the effluent disposal section 38, where any unreacted silicon chloride is frozen out, after which the exhausted hydrogen is burned. The silicon crystal on the substrate will continue to grow as the deposition run proceeds. After the deposition has proceeded for the desired length of time or until the crystal has reached the desired size, the apparatus is shut down, allowing the glass on the substrate to cool and harden, and the silicon crystal, affixed to the substrate, is removed from the reaction chamber.

Thus far, the description has concerned the production of a silicon single crystal film of high purity, but with slight modification of the apparatus, and a continuation of the deposition run silicon crystals of P- or N-type, or silicon crystals having alternate P- and N-type regions, may be formed by intentionally introducing a donor impurity to create an N-type region, or an acceptor impurity to create a P-type region. Thus, by successively depositing doped silicon of opposite conductivity types, using essentially the same apparatus it has been possible to fabricate directly onto a substrate junction devices of various shapes, areas or configurations.

Figure 3:
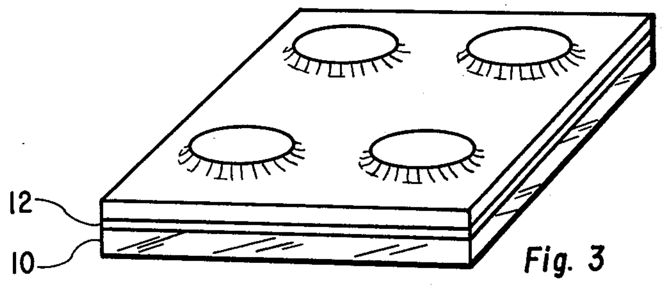
Figure 4:
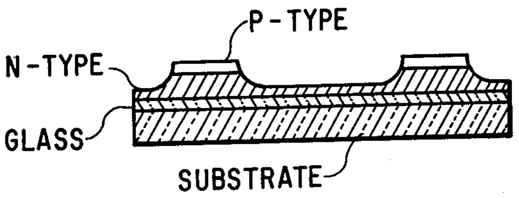

FIGS. 3 and 4 illustrate four semiconductor diodes which were deposited on a single substrate by first depositing on the molten glass 12 a crystal layer of silicon of N-conductivity type having an area coextensive with that of the substrate. Thereafter, the substrate was masked except in four spaced-apart circular areas and the deposition run continued, using doped silicon of the same conductivity type, until the unmasked areas were built up to a plateau or mesa of the desired height. Then, the introduction of donor-type impurity was stopped and a P-type impurity introduced and the deposition continued until a layer of suitable thickness of P-type silicon was built up on the mesas. The deposit still exhibited single crystal properties throughout, and the result is four junction diodes deposited in place on the substrate, ready for interconnection to other elements, for example by thin film circuit techniques. In the illustrated example, the substrate wafer was one-half inch square, with the diameter of each of the junctions approximately 0.12 inch. The thus formed diodes exhibited front-to-back resistance ratios of approximately 25,000 to 1, strong evidence that the silicon was deposited as a single crystal, since this efficiency of rectification can not be obtained with polycrystalline material. Because the deposited film is a single crystal, a junction having an area equal to that of the substrate evidently could be fabricated, and it appears to be possible to form even larger area junctions with suitable modification of the reaction chamber. The method is also applicable in the formation of devices containing more than one junction, by depositing alternate layers of opposite conductivity type material; e.g., transistors can also be fabricated directly onto a substrate.

Although in the above example a single crystal film of silicon was deposited on a glazed ceramic substrate, single crystal films may, in accordance with another feature of the invention, be deposited on substrates formed of conductive material. In a number of applications it is desirable to deposit the crystal on a conductor so as to provide an electrical terminal or thermal heat path for the resulting crystal. A number of metals are available which do not react with semiconductor materials now in common use, such as silicon and germanium, and which have melting points well below the melting points of these materials. These include lead, cadmium, thallium, bismuth, and tin. In the preparation of the surface, a ceramic wafer, such as alumina, is metallized with molymanganese, which has a high melting point, and then by electroplating or evaporating a thin film of a metal selected from the above list is deposited onto the molymanganese layer. When the thus prepared substrate is placed in the reaction chamber of FIG. 1 and heated to a temperature above the melting temperature of the electroplated film, but below the melting temperature of the molymanganese, the thin film wets the molymanganese and is held in place on the substrate by surface tension. The fluid surface provided by the molten metal affords the same high atomic mobility that is presented by the molten glass surface previously described, thereby to permit the semiconductor material to arrange itself into a single crystal.

From the above-described examples, and discussion of the process, it will be apparent that the stated objects are satisfied by the invention. The disclosed method permits the forming or growing of single crystal films on a supporting surface by deposition of material from the vapor phase. The concept of depositing the material on a fluid surface has been demonstrated with silicon, and it would appear to be possible to form single crystals of other materials and compounds, particularly semiconductor materials and compounds. For example, gallium arsenide has been grown epitaxially, which would strongly indicate that single crystals of this binary semiconductor compound can be formed employing the present method. Indeed, it appears that the method can be used with any inorganic material that will form a liquid and that will decompose into the elemental form of the material to be deposited at a temperature below the melting point of the material to be deposited. It is important, of course, that the material used to form the fluid surface be selected so as not to react with the material to be deposited, particularly if purity of the deposited material is important. Thus, although a number of materials have been suggested, care must be taken to insure that relative decomposition temperatures, melting temperatures, vapor pressures, and possible interaction of materials be examined to insure the desired results. It appears that the deposition temperature is not critical, but subject to a rather wide range of temperatures. As a general rule, the upper limit of deposition temperature appears to be determined by the melting point of the deposited material, and the lower limit is determined by either the melting point of the material of the surface, or the temperature at which the atoms being deposited possess enough energy to arrange themselves into a single crystal structure. Stated another way, the surface material might be in a molten condition, but still not have enough atomic mobility to allow the deposited material to arrange itself into a crystalline structure. In this event, it would be necessary to increase the temperature to some value above the melting temperature of the surface material.

What is claimed is:

1. The method of forming a single crystal film of a first material on a support comprising the steps of: forming on the surface of said support a coating of a second material in fluid form, said second material being solid at room temperature and of a nature as not to undesirably influence the characteristics of said first material, bringing into contact with said coating an atmosphere containing said first material and during said contact maintaining said second material at a temperature below the melting point of said first material and above the temperature necessary to maintain said second material in a fluid condition.

2. The method of forming a single crystal film of a first material on a substrate of dissimilar material comprising the steps of: coating a surface of said substrate with a second material which is solid at room temperature and which is adapted to be rendered fluid at a higher temperature, said second material being substantially chemically inert to said first material, heating said substrate in an atmosphere containing said first material to a temperature below the melting point of said first material and above the temperature necessary to maintain said second material in a fluid condition and continuing said heating until a film of said first material of desired thickness is deposited upon the fluid second material, and thereafter cooling said substrate to a temperature at which said second material is returned to its solid phase.

3. The method of fabricating on a substrate formed of non-single crystal material a single crystal film of an element selected from the group of semiconductors whose compounds in their vapor phase have a pyrolytic decomposition temperature below the melting temperature of said element, which comprises: applying to a surface of said substrate a thin coating of a second material capable of being rendered fluid at a temperature below the pyrolytic decomposition temperature of said compound and which is chemically inert to said element, heating said coated substrate in an atmosphere containing a vapor mixture of said compound and a carrier gas to a temperature in the range between the decomposition temperature of said compound and the melting temperature of said element until a film of said element of desired thickness is deposited upon the fluid second material, and thereafter cooling said substrate to a temperature at which said second material is returned to its solid phase.

4. The method according to claim 3 and wherein said second material is glass.

5. The method according to claim 3 and wherein said second material is a metal which does not adversely affect the electrical properties of the deposited film.

6. The method of directly depositing upon a flat substrate formed of non-single crystal material a single crystal film of a semiconducting element selected from the group consisting of silicon and germanium which comprises: applying to a surface of said substrate a thin coating of a second material capable of being rendered fluid at a temperature below the melting temperature of said semiconducting material and which does not confer adverse electrical properties to the deposited film, heating said substrate in an atmosphere containing the semiconducting element to a temperature below the melting point of said element and above the temperature necessary to cause said second material to become fluid and continuing said heating until a film of said element of desired thickness is deposited upon the fluid surface on said substrate, and thereafter cooling said substrate to a temperature at which said second material is returned to its solid phase.

7. The method of directly depositing a single crystal film of a semiconducting material on a flat substrate formed of non-single crystal material which comprises: applying to a surface of said substrate a thin coating of a second material which is solid at room temperature and capable of being rendered fluid at a temperature below the melting temperature of the deposited semiconductor material and the melting temperature of the substrate and which is chemically inert to the semiconducting material and does not impart adverse electrical properties to the deposited film, heating said substrate in an atmosphere containing a compound of an element selected from the group consisting of silicon and germanium to a temperature above that necessary to cause said coating material to become fluid and to cause decomposition of said compound and below the melting temperature of the deposited material and continuing said heating until a film of semiconducting material of desired thickness is deposited upon the fluid coating on the substrate, and thereafter cooling said substrate to room temperature.

8. The method according to claim 7 wherein said coating material is glass.

9. The method according to claim 7 wherein said coating material is a metal capable when fluid of wetting said surface of said substrate.

10. The method of directly fabricating a single crystal film of an element selected from the group consisting of silicon and germanium on a substrate which comprises: applying to a surface of said substrate a glaze which is solid at room temperature and capable of being rendered fluid at a temperature in the range between 1000° and 1250° C. and which does not impart adverse electrical properties to the deposited film, heating said substrate in an atmosphere containing a vapor mixture including a halide of an element selected from the group consisting of silicon and germanium to a temperature in the range between 1000° and 1250° C. until a film of said selected element of desired thickness is deposited upon the fluid glaze on said substrate, and thereafter cooling said substrate to room temperature.

11. The method of directly fabricating a single crystal film of silicon on a substrate which comprises: applying to a surface of said substrate a glaze which is solid at room temperature and capable of being rendered fluid at a temperature in the range between 1000° and 1250° C. and which is chemically inert to silicon, heating said substrate in an atmosphere containing a vapor mixture including hydrogen and a silicon halide to a temperature in the range between 1000° and 1250° until a film of silicon of desired thickness is deposited upon the fluid surface of said substrate, and thereafter cooling said substrate to room temperature.

12. The method of directly fabricating a semiconductor device on a substrate formed of non-single crystal material which comprises: applying to a surface of said substrate a thin coating of a material which is solid at room temperature and capable of being rendered fluid at a temperature below the decomposition temperature of a halide of an element selected from the group consisting of silicon and germanium and which is chemically inert to the semiconducting material and does not impart adverse electrical properties to the semiconducting material, heating said substrate in an atmosphere containing a vapor mixture of a carrier gas, a halide of an element selected from the group consisting of silicon and germanium and a first compound capable of imparting a first conductivity type to said selected element to a temperature in the range between the decomposition temperature of said halide and said compound and the melting temperature of said selected element thereby causing said coating material to become fluid, continuing said heating until a film of said selected element of first conductivity type of desired thickness is deposited upon the fluid surface on said substrate, thereafter substituting in said vapor mixture for said first compound a second compound capable of imparting to said selected element a conductivity type opposite to that of the film first deposited and continuing to heat said substrate to the temperature as aforesaid until a film of said selected element of opposite conductivity type of desired thickness is deposited upon the film of said selected element of first conductivity type, and thereafter cooling said substrate to room temperature.

13. The method according to claim 12 wherein said coating material is glass.

14. The method according to claim 12 wherein said coating material is a metal.

15. The method according to claim 12 wherein said carrier gas is hydrogen.

16. The method of directly fabricating a semiconductor device on a substrate which comprises: applying to a surface of the substrate a glaze which is solid at room temperature and capable of being rendered fluid at a temperature in the range between 1000° and 1250° C. and which does not impart adverse electrical properties to silicon, heating said substrate in an atmosphere containing a vapor mixture including a silicon halide, hydrogen and a first compound capable of imparting a first conductivity type to silicon to a temperature in the range between 1000° and 1250° C. thereby causing said glaze to become fluid and said halide and said compound to decompose, continuing said heating until a film of silicon of first conductivity type of desired thickness is deposited upon the fluid glaze, thereafter substituting in said vapor mixture for said first compound a second compound capable of imparting to silicon a conductivity type opposite to said first conductivity type and continuing to heat said substrate to the temperature as aforesaid until a film of silicon of opposite conductivity type of desired thickness is deposited upon the film of silicon of first conductivity type, and thereafter cooling said substrate to room temperature.

References Cited in the file of this patent

UNITED STATES PATENTS 2,880,117 Hanlet ---------------- Mar. 31, 1959